US012768897B2

(12) United States Patent
Yen

(10) Patent No.: US 12,768,897 B2
(45) Date of Patent: Oct. 20, 2026

(54) SMART BATTERY DETECTION DEVICE AND METHOD

(71) Applicant: Quanta Computer Inc., Taoyuan City (TW)

(72) Inventor: Wei-Ting Yen, Taoyuan City (TW)

(73) Assignee: QUANTA COMPUTER INC., Taoyuan City (TW)

( * ) Notice: Subject to any disclaimer, the term of this patent is extended or adjusted under 35 U.S.C. 154(b) by 150 days.

(21) Appl. No.: 18/828,290

(22) Filed: Sep. 9, 2024

(65) Prior Publication Data

US 2025/0362350 A1 Nov. 27, 2025

(30) Foreign Application Priority Data

May 24, 2024 (TW) ................................ 113119245

(51) Int. Cl.
*G01R 31/389* (2019.01)
*H01M 10/42* (2006.01)

(52) U.S. Cl.
CPC ...... *G01R 31/389* (2019.01); *H01M 10/4257* (2013.01); *H01M 2010/4271* (2013.01)

(58) Field of Classification Search
CPC .. G01R 31/36; G01R 31/374; G01R 31/3842; G01R 31/382; G01R 31/389; G01R 31/392; G01R 31/396; G01R 31/52; H01M 10/42; H01M 10/425; H01M 10/4257
See application file for complete search history.

(56) References Cited

U.S. PATENT DOCUMENTS 9,157,968 B1 10/2015 Taylor
2010/0247988 A1* 9/2010 Okumura ............... B60K 6/365 320/128
2011/0037475 A1* 2/2011 Ho ....................... G01R 31/389 324/427

(Continued)

FOREIGN PATENT DOCUMENTS

JP 2007221900 A 8/2007
JP 2008067523 A 3/2008

(Continued)

OTHER PUBLICATIONS

Extended European Search Report dated Mar. 25, 2025, issued in application No. EP . 24204047.5.

(Continued)

*Primary Examiner* — Huy Q Phan
*Assistant Examiner* — David B Frederiksen
(74) *Attorney, Agent, or Firm* — McClure, Qualey & Rodack, LLP

(57) ABSTRACT

A smart battery detection device is provided in the invention. The smart battery detection device may include a battery pack and a processor. The battery pack may include a microcontroller and at least one battery cell. In a charging mode, the microcontroller may obtain an initial direct current internal resistance (DCIR) value corresponding to the battery pack, and detect a DCIR value currently corresponding to the battery pack at each relative state of charge (RSOC) check point. The processor may be coupled to the battery pack, and obtain the DCIR value. At least one of the microcontroller and the processor may determine whether there are any errors in the battery pack.

7 Claims, 4 Drawing Sheets

(56) References Cited

U.S. PATENT DOCUMENTS

| | | | | |
|---|---|---|---|---|
| 2018/0010919 | A1* | 1/2018 | Huang | H01M 10/482 |
| 2019/0207267 | A1* | 7/2019 | Vickery | B60L 50/66 |
| 2020/0251915 | A1* | 8/2020 | Singer | H01M 10/482 |
| 2023/0152384 | A1* | 5/2023 | Ali-Ogalli | G01R 19/1659 324/430 |
| 2023/0231209 | A1 | 7/2023 | Yamagami | |
| 2025/0383408 | A1* | 12/2025 | Yang | G01R 31/389 |

FOREIGN PATENT DOCUMENTS

| | | | | |
|---|---|---|---|---|
| JP | 2009142150 | A | 6/2009 | |
| KR | 20210077948 | A | 6/2021 | |
| KR | 20220085587 | A | 6/2022 | |
| KR | 20220131703 | A | 9/2022 | |
| KR | 20220147950 | A | 11/2022 | |
| KR | 20230171293 | A | 12/2023 | |
| KR | 20240032608 | A | 3/2024 | |
| KR | 20240053903 | A | 4/2024 | |
| KR | 20240061508 | A | 5/2024 | |
| WO | 2007142195 | A1 | 12/2007 | |
| WO | 2023244017 | A1 | 12/2023 | |
| WO | WO-2023249174 | A1 * | 12/2023 | G01R 31/52 |

OTHER PUBLICATIONS

Japanese language office action dated Oct. 28, 2025, issued in application No. JP 2024-183592.

KR Office Action dated Jun. 27, 2025 in KR application No. 10-2024-0154419.

Chinese language office action dated Jan. 13, 2025, issued in application No. TW 113119245.

* cited by examiner

SMART BATTERY DETECTION DEVICE AND METHOD

CROSS REFERENCE TO RELATED APPLICATIONS

This application claims priority of TW patent application No. 113119245 filed on May 24, 2024, the entirety of which is incorporated by reference herein.

BACKGROUND OF THE INVENTION

Field of the Invention

The invention generally relates to smart battery detection technology, and more particularly, to smart battery detection technology for detecting whether there is a welding error.

Description of the Related Art

Modern electronic products like smartphones, tablets, and notebook computers are powered by batteries. A battery may comprise a battery pack which is composed of a plurality of battery cells.

Spot welding is a welding method which is usually used to connect battery cells to a battery pack. Battery cells may be connected to each other by spot welding to ensure lower resistance and a reliable electrical-connection. However, in some situations, no welding errors are detected in the battery pack when the battery leaves the factory (i.e., the battery cells in the battery pack are normal when the battery leaves the factory), but after the battery has been used for a long time, such errors arise. Therefore, welding errors may not be found easily in these situations.

Therefore, how to instantly determine whether there is a welding error in the battery pack is a subject that is worthy of discussion.

BRIEF SUMMARY OF THE INVENTION

A smart battery detection device and method are provided to overcome the problems mentioned above.

An embodiment of the invention provides a smart battery detection device. The smart battery detection device may include a battery pack and a processor. The battery pack may comprise a microcontroller and at least one battery cell. In a charging mode, the microcontroller may obtain an initial direct current internal resistance (DCIR) value corresponding to the battery pack, and detect a DCIR value currently corresponding to the battery pack at each relative state of charge (RSOC) check point. The processor may be coupled to the battery pack, and obtain the DCIR value. At least one of the microcontroller and the processor may determine whether there are any errors in the battery pack.

In some embodiments of the invention, after the default number of charging and discharging cycles, the initial DCIR value corresponding to the battery pack may be increased by a default proportion.

In some embodiments of the invention, when the processor or the microcontroller determines whether there is an error in the battery pack, the processor or the microcontroller may determine whether the DCIR value is higher than a first tolerance value, and determine whether the DCIR value is lower than a second tolerance value. The first tolerance value may be the initial DCIR value plus a default value, and the second tolerance value may be the initial DCIR value minus a default value.

In some embodiments of the invention, when the processor or the microcontroller determines that the DCIR value is not higher than the first tolerance value, and determines that the DCIR value is not lower than the second tolerance value, the processor or microcontroller may determine that there is no error in the battery pack.

In some embodiments of the invention, when the processor or the microcontroller determines that the DCIR value is higher than the first tolerance value, or it determines that the DCIR value is lower than the second tolerance value, the processor or the microcontroller may further determine whether the battery pack has voltage.

In some embodiments of the invention, when the processor or the microcontroller determines that the battery pack has voltage, the processor or the microcontroller may further determine whether there is a battery cell imbalance in the battery pack.

In some embodiments of the invention, when there is no battery cell imbalance in the battery pack, the processor or the microcontroller may determine that there is a welding error in the battery pack.

An embodiment of the invention provides a smart battery detection method. The smart battery detection method may be applied to a smart battery detection device. The smart battery detection method may comprise following steps. In a charging mode, a microcontroller of a battery pack of the smart battery detection device may obtain an initial direct current internal resistance (DCIR) value corresponding to the battery pack. Then, the microcontroller may detect a DCIR value currently corresponding to the battery pack at each relative state of charge (RSOC) check point. Then, a processor of the smart detection device may obtain the DCIR value corresponding to the battery pack. Then, at least one of the microcontroller and the processor may determine whether there are any errors in the battery pack.

Other aspects and features of the invention will become apparent to those with ordinary skill in the art upon review of the following descriptions of specific embodiments of a smart battery detection device and method.

BRIEF DESCRIPTION OF THE DRAWINGS

The invention will become more fully understood by referring to the following detailed description with reference to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
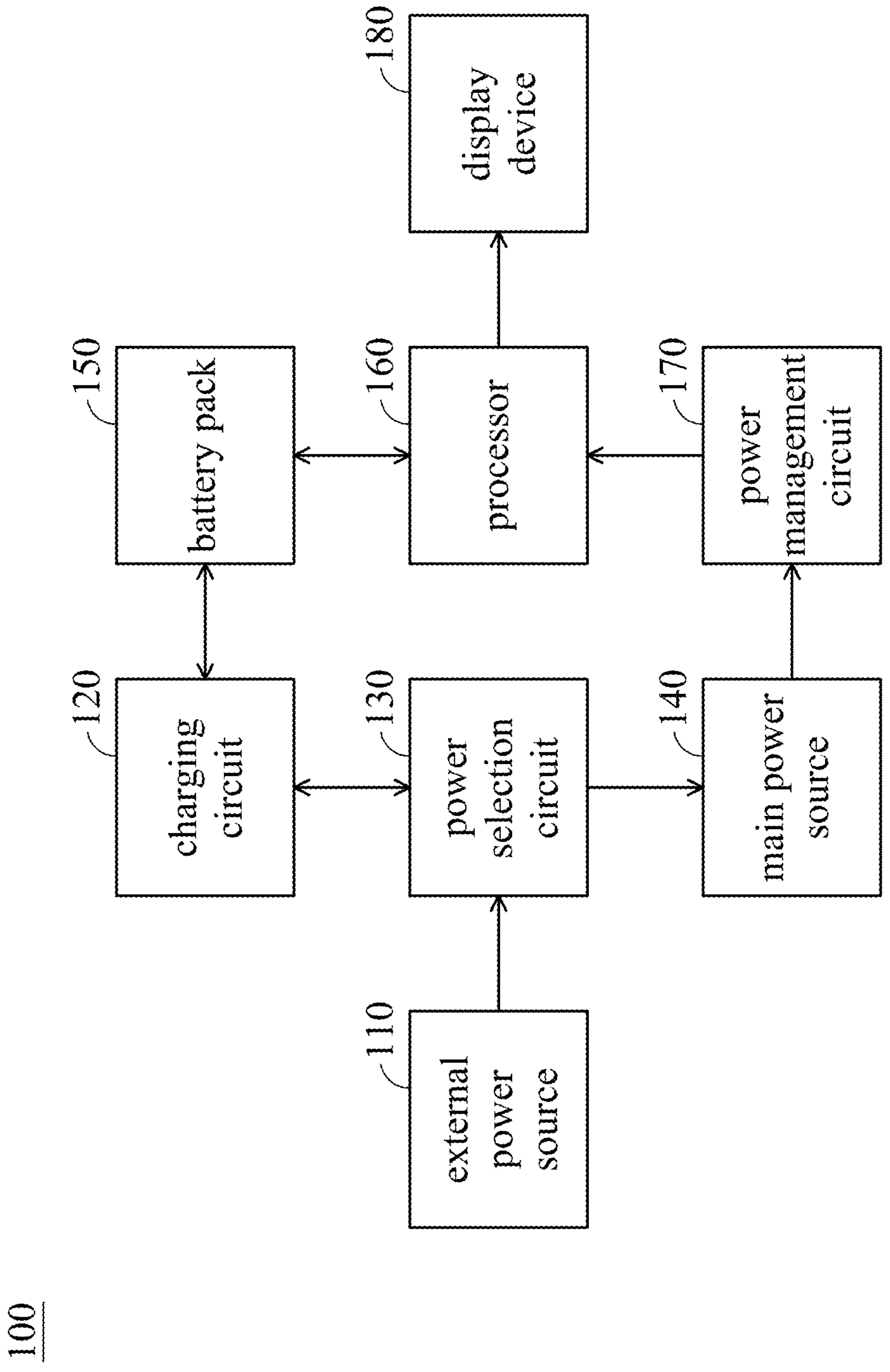
FIG. 1 is a block diagram of a smart battery detection device 100 according to an embodiment of the invention.

FIG. 1 is a block diagram of a smart battery detection device 100 according to an embodiment of the invention. As shown in FIG. 1, the smart battery detection device 100 may comprise an external power source 110, a charging circuit

120, a power selection circuit 130, a main power source 140, a battery pack 150, a processor 160, a power management circuit 170, and a display device 180. It should be noted that FIG. 1 presents a simplified block diagram in which only the elements relevant to the invention are shown. However, the invention should not be limited to what is shown in FIG. 1. The smart battery detection device 100 may also comprise other elements.

The external power source 110 may be an alternating current/direct current (AC/DC) power adaptor, or a Universal Serial Bus (USB) charger. When the external power source 110 is electrically connected to the smart battery detection device 100, the external power source 110 may charge the battery pack 150. Specifically, when the external power is electrically connected to the smart battery detection device 100, the power selection circuit 130 may detect that the connection of the external power source 110. Therefore, the power selection circuit 130 may transmit an indication signal to the charging circuit 120. After the charging circuit 120 receives the indication signal from the power selection circuit 130, the charging circuit 120 may transmit the indication signal to the battery pack 150 to charge the battery pack 150. In addition, when the power selection circuit 130 detects that the external power source 110 has been connected to the smart battery detection device 100, the power selection circuit 130 may transmit the power from the external power source 110 to the main power source 140. Then, the main power source 140 may transmit the power to the power management circuit 170 to provide the power to the processor 160 through the power management circuit 170.

In addition, when the external power source 110 is not connected to the smart battery detection device 100, the power selection circuit 130 does not detect the external power source 110, and the power selection circuit may transmit the power from the battery pack 150 to the main power source 140. Then, the main power source 140 may transmit the power to the power management circuit 170 to provide the power to the processor 160 through the power management circuit 170.

The display device 180 may be a monitor or a light-emitting diode (LED) device, but the invention should not be limited thereto. The display device 180 may display the alarm signal or alarm information according to the indication from the processor 160 to notify the battery pack 150 that the welding error may occur.

According to an embodiment of the invention, the smart battery detection device 100 may also comprise a storage device (not show in figures). The storage device may be a volatile memory (e.g. Random Access Memory (RAM)), or a non-volatile memory (e.g. flash memory, Read Only Memory (ROM)), a hard disk, or a combination of the above memory devices. The storage device 130 may be configured to store the files and data about the smart battery detection method, and store related the software program codes required by the processor 160 when the processor 160 performs the operations and calculations of the smart battery detection.

Figure 2:
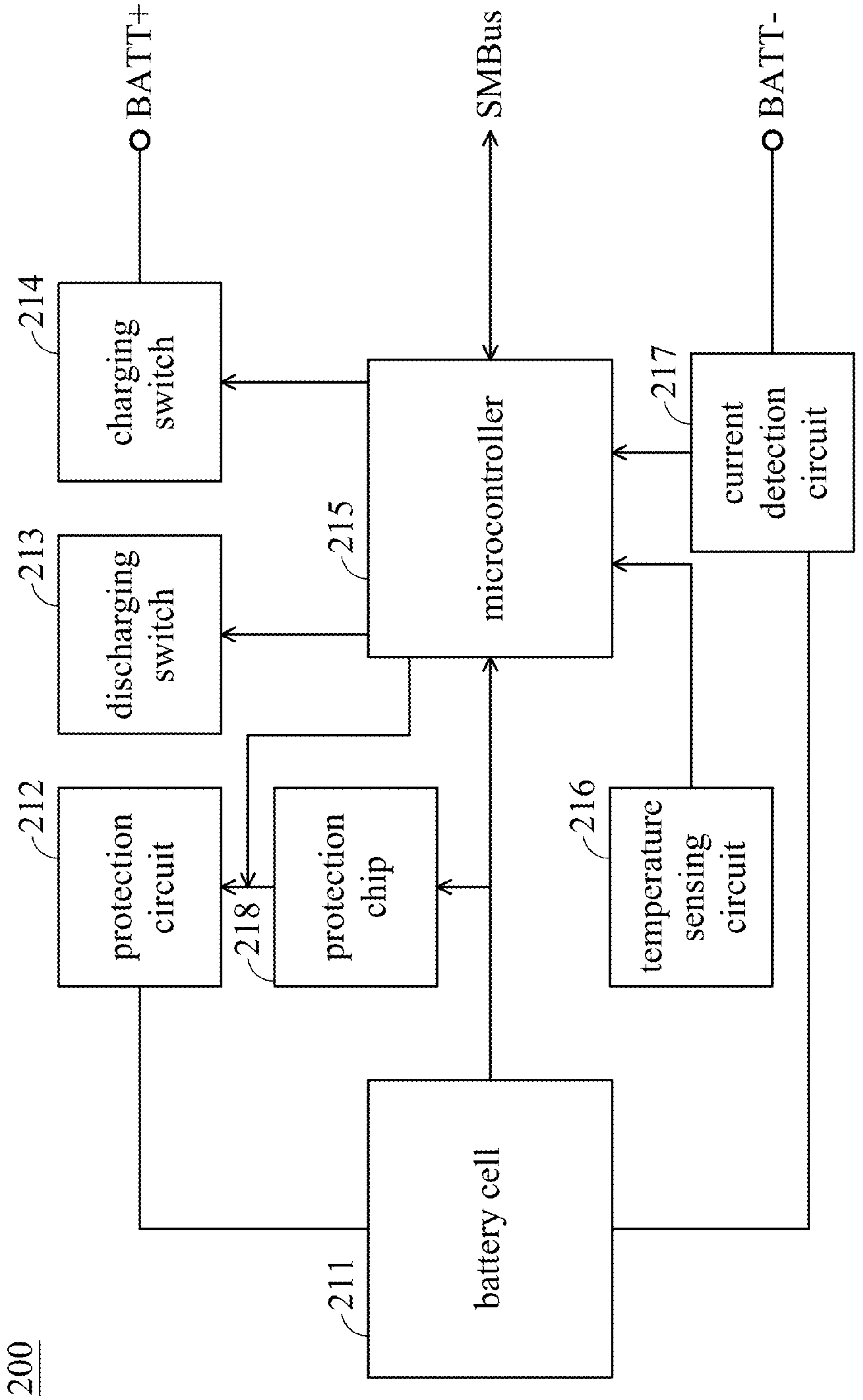
FIG. 2 is a block diagram of a battery pack 200 according to an embodiment of the invention.

FIG. 2 is a block diagram of a battery pack 200 according to an embodiment of the invention. The battery pack 200 may be applied to the battery pack 150. As shown in FIG. 2, the battery pack 200 may comprise at least one battery cell 211, a protection circuit 212, a discharging switch 213, a charging switch 214, a microcontroller 215, a temperature sensing circuit 216, a current detection circuit 217 and a protection chip 218. It should be noted that FIG. 2 presents a simplified block diagram in which only the elements relevant to the invention are shown. However, the invention should not be limited to what is shown in FIG. 2. The battery pack 200 may also comprise other elements.

The battery cell 211 may transform the received electrical energy to chemical energy, and then store the chemical energy, or the battery cell 211 may transform the stored chemical energy to electrical energy, and then output the electrical energy. In addition, the battery cell 211 may output the electrical energy to the protection circuit 212. The protection circuit 212 may control the electrical energy from the battery cell 211 to output through a positive electrode BATT+, and reflow to the battery cell 211 through a negative electrode BATT−. In addition, the protection circuit 212 may control an external power source (not shown in FIG. 2) of the battery pack 200 to charge the battery cell 211. The discharging switch 213 may be electrically connected to the protection circuit 212 and the charging switch 214. The charging switch 214 may be electrically connected to the positive electrode BATT+ and the discharging switch 213. The discharging switch 213 may be enabled or disabled according to the signal from the protection circuit 212.

The protection chip 218 may be electrically connected to the battery cell 211, and determine whether to enable a protection mechanism according to the status (e.g., the charging voltage, charging current, or discharging current) of the battery cell 211. In some embodiments, the protection mechanism may comprise the over-voltage protection (OVP), over-current protection (OCP), over-temperature protection (OTP), under-voltage protection (UVP), under-temperature protection (UTP), reverse-current protection, short-circuit protection, and so on.

The microcontroller 215 may receive the external signals of the battery pack 200 through a communication bus (e.g., system management bus (SMBus), where the SMBus may comprise SMBUS_DATA (SMD) and SMBUS_CLOCK (SMC)). In other words, the battery pack 200 may communicate with the processor (e.g., processor 160) of a smart battery detection device which comprises the battery pack 200. The microcontroller 215 may detect the direct current internal resistance (DCIR) and the relative state of charge (RSOC) of the battery cell 211 according to the charging current, discharging current, charging voltage, discharging voltage of the battery cell 211.

The temperature sensing circuit 216 may be configured to detect the temperature of the battery pack 200, and transmit the detected temperature information to the protection chip 218. In some embodiments, the temperature sensing circuit 216 may be a temperature sensing chip. In some embodiments, the temperature sensing circuit 216 may comprise a thermistor, and its resistance may be changed based on temperature. In some embodiments, the microcontroller 215 may measure the cross-voltage of the two ends of the current detection circuit 217 to calculate the charging current in the charging mode.

According to an embodiment of the invention, when a battery pack (e.g., battery pack 150 and battery pack 200) of a smart battery detection device is in a charging mode, the microcontroller (e.g., microcontroller 215) of the battery pack may obtain an initial DCIR value corresponding to the battery pack. The battery aging may occur when the battery is used for a long time. Therefore, when the microcontroller determines the initial DCIR value, the microcontroller may further concern the age factor corresponding to the battery. Specifically, after the default number of charging and discharging cycles (e.g., 100 times), the microcontroller may increase the initial DCIR value by a default proportion (e.g., increase 10%) to adjust the initial DCIR value to an appropriate value. For example, after the battery has been charged and discharged 100 times, the microcontroller may increase the initial DCIR value by 10%. Accordingly, after the battery has been charged and discharged 200 times, the microcontroller may increase the initial DCIR value by 10% again.

When the microcontroller obtains the initial DCIR value corresponding to the battery pack, the microcontroller may detect the DCIR value currently corresponding to the detected battery pack at each RSOC check point. For example, the microcontroller may detect the DCIR value currently corresponding to the detected battery pack at each time point of the RSOC is increased by 20% (e.g., the time points of the RSOC increased by 20%, 40%, 60% and 80%).

According to an embodiment of the invention, when the microcontroller has detected the current DCIR value of the battery pack, the microcontroller may determine whether an error occur in the battery pack, according to the current DCIR value of the battery pack. In an embodiment, the microcontroller may determine whether the current DCIR value of the battery pack is higher than a first tolerance value, and determine whether the current DCIR value of the battery pack is lower than a second tolerance value. The first tolerance value may be the initial DCIR value plus a default value (e.g., initial DCIR value+3% initial DCIR value), and the second tolerance value may be the initial DCIR value minus a default value (e.g., initial DCIR value-3% initial DCIR value).

When the current DCIR value of the battery pack is not higher than a first tolerance value, and the current DCIR value of the battery pack is not lower than a second tolerance value, the microcontroller may determine that there is no error in the battery pack. Therefore, the battery pack will be charged continuously in the charging mode.

When the current DCIR value of the battery pack is higher than a first tolerance value, or the current DCIR value of the battery pack is lower than a second tolerance value, the microcontroller may determine whether the battery pack has any voltage first. When the microcontroller determines that the battery pack has no voltage, the microcontroller may determine whether the battery pack is in a charging mode. If the battery pack is in the charging mode, the microcontroller may perform the operations and calculations of DCIR value discussed above again.

When the microcontroller determines that the battery pack has voltage, the microcontroller may determine whether a battery cell imbalance occurs. The battery cell balance mechanism is a protection mechanism when the differential value of the voltage values between the battery cells in a battery pack is higher than a default value (e.g., 0.5 volt (V)). When a battery cell imbalance occurs, a cell imbalance (CIM) flag may be triggered (e.g., the value of CIM flag may be set to 1) to indicate there is a battery cell imbalance. Therefore, when the microcontroller determines that there is no battery cell imbalance (i.e., the CIM flag is not triggered), the microcontroller may determine that there is a welding error in the battery pack, and the microcontroller may notify the processor (e.g., processor 160) of the smart battery detection device of the welding error information. In an embodiment, when the microcontroller determines that there is a welding error in the battery pack, a battery connect issue (BCI) flag may be triggered, e.g., the value of the BCI flag may be set to 1.

According to another embodiment of the invention, the operation of determining whether there are any errors in the battery pack according to the current DCIR value of the battery pack may also performed by the processor of the smart battery detection device. That is, the processor may obtain the DCIR value from the battery pack, and then perform the above operations for determining whether there are any errors in the battery pack.

According to another embodiment of the invention, both of the microcontroller and the processor of the smart battery detection device may perform the above operations for determining whether there are any errors in the battery pack. Then, the processor may evaluate the determination results of the microcontroller and the processor.

The default values of the invention (e.g., the values of age factor, initial DCIR value of charging and discharging cycles, and so on) may be set or updated through a machine learning method or a deep learning method.

Figure 3:
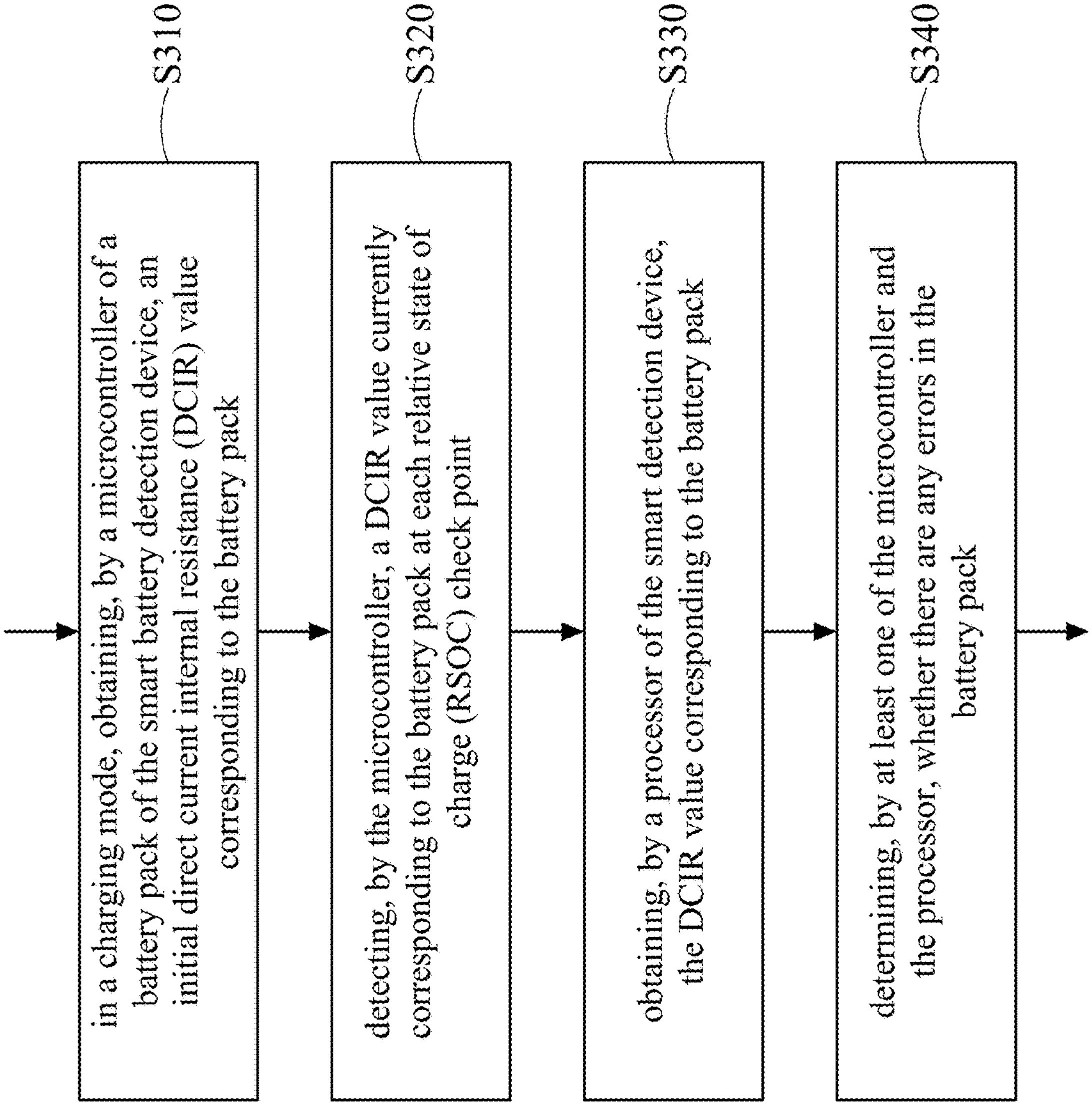
FIG. 3 is a flow chart illustrating a smart battery detection method according to an embodiment of the invention.

FIG. 3 is a flow chart illustrating a smart battery detection method according to an embodiment of the invention. The smart battery detection method can be applied to the smart battery detection device 100 and the battery pack 200. As shown in FIG. 3, in step S310, when the smart battery detection device 100 is in a charging mode, a microcontroller of a battery pack of the smart battery detection device 100 may obtain an initial DCIR value corresponding to the battery pack.

In step S320, the microcontroller of the battery pack of the smart battery detection device 100 may detect a DCIR value currently corresponding to the battery pack at each RSOC check point.

In step S330, the processor of the smart battery detection device 100 may obtain the DCIR value.

In step S340, the processor and/or the microcontroller may determine whether there are any errors occur in the battery pack according to the DCIR value.

Figure 4:
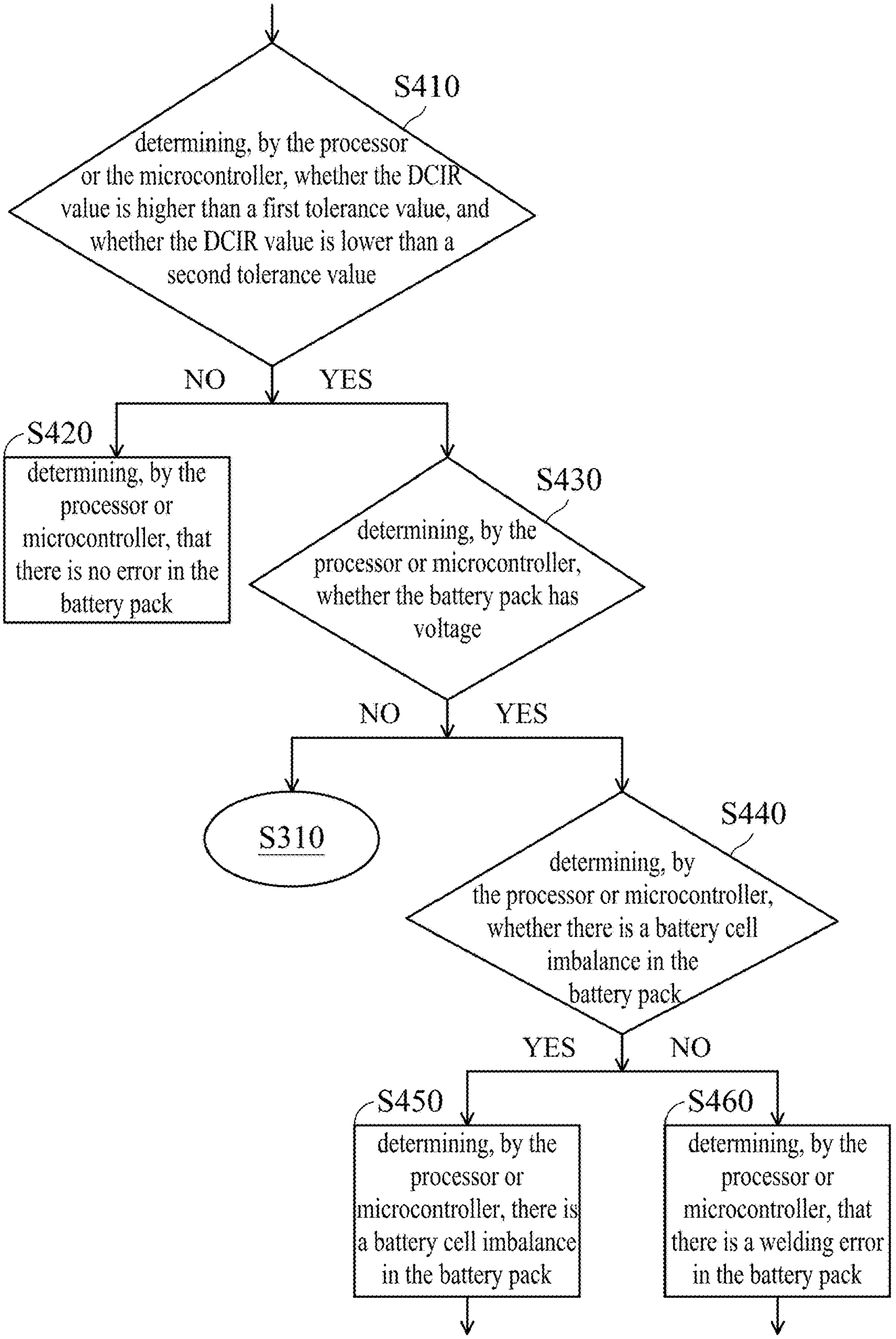
FIG. 4 is a flow chart illustrating step S340 according to an embodiment of the invention.

FIG. 4 is a flow chart illustrating step S340 according to an embodiment of the invention. The flow of FIG. 4 can be applied to the smart battery detection device 100 and the battery pack 200. As shown in FIG. 4, in step S410, the processor and/or the microcontroller may determine whether the DCIR value is higher than a first tolerance value, and determine whether the DCIR value is lower than a second tolerance value. The first tolerance value is the initial DCIR value corresponding to the battery pack plus a default value, and the second tolerance value is the initial DCIR value corresponding to the battery pack minus a default value. According to an embodiment of the invention, after the default number of charging and discharging cycles, the initial DCIR value corresponding to the battery pack may be increased by a default proportion.

If the processor and/or microcontroller determines that the DCIR value is not higher than the first tolerance value, and the DCIR value is not lower than the second tolerance value, step S420 is performed. In step S420, the processor and/or microcontroller may determine that there is no error in the battery pack.

If the processor and/or microcontroller determines that the DCIR value is higher than the first tolerance value, or the DCIR value is lower than the second tolerance value, step S430 is performed. In step S430, the processor and/or microcontroller may determine whether the battery pack has voltage.

If the processor and/or microcontroller determines that the battery pack does not have voltage, flow backs to step S310. If the processor and/or microcontroller determines that the battery pack has voltage, step S440 is performed. In step S440, the processor and/or microcontroller may determine whether there is a battery cell imbalance in the battery pack.

In step S450, the processor and/or microcontroller may determine that there is a battery cell imbalance in the battery pack.

In step S460, the processor and/or microcontroller may determine that there is a welding error in the battery pack (i.e., the battery pack does not have a battery cell imbalance).

According to the smart battery detection method provided in the invention, the smart battery detection may immediately determine whether there is a welding error in the battery pack.

Use of ordinal terms such as "first", "second", "third", etc., in the disclosure and claims is for description. It does not by itself connote any order or relationship.

The steps of the method described in connection with the aspects disclosed herein may be embodied directly in hardware, in a software module executed by a processor, or in a combination of the two. A software module (e.g., including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such that the processor can read information (e.g., code) from and write information to the storage medium. A sample storage medium may be integral to the processor. The processor and the storage medium may reside in an ASIC. The ASIC may reside in user equipment. Alternatively, the processor and the storage medium may reside as discrete components in user equipment. Moreover, in some aspects any suitable computer-program product may comprise a computer-readable medium comprising codes relating to one or more of the aspects of the disclosure. In some aspects a computer program product may comprise packaging materials.

The above paragraphs describe many aspects. Obviously, the teaching of the invention can be accomplished by many methods, and any specific configurations or functions in the disclosed embodiments only present a representative condition. Those who are skilled in this technology will understand that all of the disclosed aspects in the invention can be applied independently or be incorporated.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A smart battery detection device, comprising:

a battery pack, comprising a microcontroller and at least one battery cell, wherein in a charging mode, the microcontroller obtains an initial direct current internal resistance (DCIR) value corresponding to the battery pack, and detects a DCIR value currently corresponding to the battery pack at each relative state of charge (RSOC) check point; and a processor, coupled to the battery pack, and obtaining the DCIR value, wherein at least one of the microcontroller and the processor determines whether there is an error in the battery pack, wherein when the processor or the microcontroller determines whether there is the error in the battery pack, the processor or the microcontroller determines whether the DCIR value is higher than a first tolerance value, and determines whether the DCIR value is lower than a second tolerance value, wherein the first tolerance value is the initial DCIR value plus a default value, and the second tolerance value is the initial DCIR value minus a default value, wherein when the processor or the microcontroller determines that the DCIR value is higher than the first tolerance value, or that the DCIR value is lower than the second tolerance value, the processor or the microcontroller further determines whether the battery pack has voltage.

2. The smart battery detection device of claim 1, wherein after a default number of charging and discharging cycles, the initial DCIR value corresponding to the battery pack is increased by a default proportion.

3. The smart battery detection device of claim 1, wherein when the processor or the microcontroller determines that the DCIR value is not higher than the first tolerance value, and determines that the DCIR value is not lower than the second tolerance value, the processor or microcontroller determines that there is no error in the battery pack.

4. The smart battery detection device of claim 1, wherein when the processor or the microcontroller determines that the battery pack has voltage, the processor or the microcontroller further determines whether there is a battery cell imbalance in the battery pack.

5. The smart battery detection device of claim 4, wherein when there is no battery cell imbalance in the battery pack, the processor or the microcontroller determines that there is a welding error in the battery pack.

6. A smart battery detection method, applied to a smart battery detection device, comprising:

in a charging mode, obtaining, by a microcontroller of a battery pack of the smart battery detection device, an initial direct current internal resistance (DCIR) value corresponding to the battery pack;

detecting, by the microcontroller, a DCIR value currently corresponding to the battery pack at each relative state of charge (RSOC) check point;

obtaining, by a processor of the smart detection device, the DCIR value corresponding to the battery pack; and determining, by at least one of the microcontroller and the processor, whether there are any errors in the battery pack, wherein when the processor or the microcontroller determines whether there is an error in the battery pack, the method further comprises:

determining, by the processor or the microcontroller, whether the DCIR value is higher than a first tolerance value, and whether the DCIR value is lower than a second tolerance value, wherein the first tolerance value is the initial DCIR value plus a default value, and the second tolerance value is the initial DCIR value minus a default value; and when the processor or the microcontroller determines that the DCIR value is higher than the first tolerance value, or that the DCIR value is lower than the second tolerance value, determining, by the processor or the microcontroller, whether the battery pack has voltage.

7. The smart battery detection method of claim 6, further comprising:

after the default number of charging and discharging cycles, increasing the initial DCIR value corresponding to the battery pack by a default proportion.

* * * * *